United States Patent
Feng et al.

(10) Patent No.: US 7,286,583 B2
(45) Date of Patent: Oct. 23, 2007

(54) SEMICONDUCTOR LASER DEVICES AND METHODS

(75) Inventors: Milton Feng, Champaign, IL (US);
Nick Holonyak, Jr., Urbana, IL (US);
Richard Chan, Champaign, IL (US);
Gabriel Walter, Champaign, IL (US)

(73) Assignee: The Board of Trustees of the University of Illinois, Urbana, IL (US)

(*) Notice: Subject to any disclaimer, the term of this patent is extended or adjusted under 35 U.S.C. 154(b) by 128 days.

(21) Appl. No.: 11/068,561

(22) Filed: Feb. 28, 2005

(65) Prior Publication Data

US 2007/0223547 A1    Sep. 27, 2007

Related U.S. Application Data

(63) Continuation-in-part of application No. 10/861,103, filed on Jun. 4, 2004, now Pat. No. 7,091,082, which is a continuation-in-part of application No. 10/646,457, filed on Aug. 22, 2003, now abandoned, application No. 11/068,561, which is a continuation-in-part of application No. 10/861,320, filed on Jun. 4, 2004, which is a continuation-in-part of application No. 10/646,457.

(51) Int. Cl.
*H01S 3/13* (2006.01)

(52) U.S. Cl. ........................................ 372/30
(58) Field of Classification Search ........... 372/30
See application file for complete search history.

(56) References Cited

U.S. PATENT DOCUMENTS

| | | | |
|---|---|---|---|
| 2,569,347 A | 9/1951 | Shockley | |
| 4,485,391 A | 11/1984 | Poulain et al. | 357/19 |
| 4,710,936 A | 12/1987 | Shibata et al. | 372/45 |
| 4,845,535 A | 7/1989 | Yamanishi et al. | 315/172 |
| 5,239,550 A | 8/1993 | Jain | 372/45 |
| 5,293,050 A | 3/1994 | Chapple-Sokol et al. | 257/17 |
| 5,334,854 A | 8/1994 | Ono et al. | 257/13 |
| 5,389,804 A | 2/1995 | Yokoyama et al. | 257/197 |
| 5,399,880 A | 3/1995 | Chand | 257/21 |
| 5,414,273 A | 5/1995 | Shimura et al. | 257/17 |

(Continued)

OTHER PUBLICATIONS

P. Grossman, and J. Choma, Jr., "Large Signal Modeling of HBT's Including Self-Heating and Transit Time Effects" IEEE Transactions On Microwave Theory And Techniques, vol. 40, No. 3, Mar. 1992.

(Continued)

*Primary Examiner*—Dung (Michael) T. Nguyen
(74) *Attorney, Agent, or Firm*—Martin Novack

(57) ABSTRACT

A method for producing controllable light pulses includes the following steps: providing a heterojunction bipolar transistor structure including collector, base, and emitter regions of semiconductor materials; providing an optical resonant cavity enclosing at least a portion of the transistor structure; and coupling electrical signals with respect to the collector, base, and emitter regions, to switch back and forth between a stimulated emission mode that produces output laser pulses and a spontaneous emission mode. In a form of the method, the electrical signals include an AC excitation signal, and part of each excitation signal cycle is operative to produce stimulated emission, and another part of each excitation signal cycle is operative to produce spontaneous emission.

24 Claims, 16 Drawing Sheets

U.S. PATENT DOCUMENTS

| | | | |
|---|---|---|---|
| 5,780,880 | A | 7/1998 | Enquist ............... 257/197 |
| 5,796,714 | A | 8/1998 | Chino et al. ............ 372/50 |
| 6,337,494 | B1 | 1/2002 | Ryum et al. ............ 257/197 |
| 6,479,844 | B2 | 11/2002 | Taylor ................... 257/192 |
| 6,737,684 | B1 * | 5/2004 | Takagi et al. ........... 257/194 |
| 2002/0030195 | A1 | 3/2002 | Yoshii et al. ............ 257/101 |

OTHER PUBLICATIONS

Y. Mori, J. Shibata, Y. Sasai, H. Serizawa, and T. Kajiwara, "Operation Principle Of The InGaAsP/InP Laser Transistor", Appl. Phys. Lett. 47(7), Oct. 1, 1985.

J. Genoe, C. Van Hoof, K. Fobelets, R. Mertens, and G. Borghs, "pnp Resonant Tunneling Light Emitting Transistor" Appl. Phys. Lett. 62 (9), Aug. 31, 1992.

P. Berger, N. Chand, and N. Dutta, "An AlGaAs Double-Heterojuction Bipolar Transistor Grown By Molecular-Beam Epitaxy", Appl. Phys. Lett. 59 (9), Aug. 26, 1991.

E. Zanoni, L. Vendrame, and P. Pavan, "Hot-Electron Electroluminescence in AlGaAs/GaAs Heterojunction Bipolar Transistors", Appl. Phys. Lett. 62(4), Jan. 25, 1993.

M. Harris, B. Wagner, S. Halpern and M. Dobbs, "Full Two-Dimensional Electroluminescent (EL) Analysis of GaAs/AlGaAs HBTs", IEEE 99CH36296. 37th Annual International Reliability Physics Symposium, San Diego., California, 1999.

K. Wang, P. Asbeck, M. Chang, G. Sullivan, and D. Millar, "Noninterfering Optical Method Of HBT Circuit Evaluation", Electronics Letters, vol. 25 No. 17, Aug. 17, 1989.

J. Shibata, Y. Mori, Y. Sasai, N. Hase, H. Serizawa, and T. Kahwara "Fundamental Characteristics Of An InGaAsP/InP Laser Transistor", Electronic Letters, vol. 21, p. 98, 1985.

J. Bardeen and W.H. Brattain, "The Transistor, A Semi-conductor Triode," Physical Review 74, 230-234 (1948).

W. Shockley, "The Theory of p-n Junctions in Semiconductors and p-n Junction Transistors," Bell System Technology Journal 28, 435-489 (1949).

R.N. Hall, G.E. Fenner, J.D. Kingsley, T.J. Soltys, and R.O. Carlson, "Coherent Light Emission From GaAs Junctions," Phys. Rev. Lett., vol. 9. pp. 366-368, Nov. 1, 1962.

M.I. Nathan, W.P. Dumke, G. Burns, F.H. Dill, Jr., and G. Lasher, "Stimulated Emission of Radiation From GaAs p-n Junction," Appl. Phys. Lett., vol. 1, pp. 62-64. Nov. 1962.

N. Holonyak, Jr. and S.F. Bevacqua, "Coherent (Visible) Light Emission From GaAs $_{1-x}$P$_x$ Junctions," Appl. Phys. Lett., vol. 1, pp. 82-83, Dec. 1962.

T.M. Quist, R.H. Rediker, R.J. Keyes, W.E. Krag, B. Lax, A.L. McWhorter, and H.J. Zeiger, "Semiconductor Maser of GaAs," Appl. Phys. Lett, vol. 1. pp. 91-92, Nov. 1962.

H. Kroemer, "Theory Of A Wide-Gap Emitter For Transistors," Proceedings of the IRE 45, 1535-1537 (1957).

W. Hafez, J.W. Lai and M. Feng, "InP/InGaAs SHBTs with 75 nm Collector and fr>500 GHz", Electronic Letters, vol. 39, No. 20, Oct. 2003.

W. Hafez, J.W. Lai, and M. Feng "Record $f_T$ and $f_T + f_{MAX}$ Performance of InP/InGaAs Single Heterojunction Bipolar Transistors," Electronics Letters, May 2003.

W. Hafez, J.W. Lai, and M. Feng. "Sub-micron InP/InGaAs Single Heterojuction Bipolar Transistors With $f_T$ of 377 GHz," IEEE Electron Device Letters, May 2003.

W. Hafez, J.W. Lai and M. Feng, "Vertical Scaling of 0.25 um Emitter InP/InGaAs Single Heterojunction Bipolar Transistors With $f_T$ of 452 GHz," IEEE Electron Devices Letters, Jul. 2003.

P. Enquist, A. Paolella, A.S. Morris, F.E. Reed, L. DeBarros, A.J. Tessmer, and J.A. Hutchby, "Performance Evaluation Of Heterojunction Bipolar Transistors Designed For High Optical Gain", Research Triangle Institute, Research Triangle Park, NC, ARL, Research Laboratory, Ft. Monmouth, NJ, Applied Research and Technology, Wake Forest, NC, , IEEE, pp. 278-287, 1995.

Yukihiko Arai, Masaaki Sakuta, Hiroshi Takano, Takashi Usikubo, Ryozo Furukawa, and Masao Kobayashi, "Optical Devices From AlGaAs-GaAs HBTs Heavily Doped With Amphoteric Si", IEEE Transactoins On Electron Devices, pp. 632-638, Vo. 42. No. 4, Apr. 1995.

G.W. Taylor, R.S. Mand, J.G. Simmons, and A.Y. Cho, "Ledistor—A Three-Terminal Double Heterostructure Optoelectronic Switch", Appl. Phys. Lett. 50(6), Feb. 9, 1987.

N. Holonyak "Quantum-Well And Superlattice Lasers: Fundamental Effects" pp. 1-18, in "The Physics Of Submicron Structures", Plenum Press, 1984.

V. Ryzhii, M. Willander, M. Ryzhii and I. Khmyrova, "Heterostructure Laser-Transistors Controlled By Resonant-Tunneling Electron Extraction", Semicond. Sci. Technol. 12 (1997) 431-438.

V. Ryzhi and I. Khmyrova, "Bistability Effect In Laser-Transistor Resonant-Tunneling Structure" Solid-State Electronics vol. 37 Nos. 4-6 pp. 1259-1262, 1994.

R. Bhat, W.-P. Hong, C. Caneau, M. A. Koza, C.-K. Nguyen, and S. Goswami, "InP/GaAsSb/InP And InP/GaAsSb/InGaAsp Double Heterojuction Bipolar Transistors With A Carbon-Doped Base Grown By Organometallic Chemcial Vapor Deposition" Appl. Phys. Lett. 68, 985 (1996).

T. McDermott, E. R. Gertner, S. Pittman, C. W. Seabury, and M. F. Chang, "Growth And Doping Of GaAsSb Via Metalorganic Chemical Vapor Deposition For InP Heterojuction Bipolar Transistors" Appl. Phys. Lett. 58, 1386 (1996).

Dvorak, C. R. Bolognesi, O. J. Pitts, and S. P. Watkins, "300 GHz InP/GaAsSb/InP Double HBTs With High Current Capability Any $BV_{CEO} \geqq 6$ V" IEEE Elec. Dev. Lett. 22, 361 (2001).

V. de Walle, "Band Lineups And Deformation Potentials In The Model-Solid Theory" Physical Review B 39, 1871 (1989).

M. Feng, N. Holonyak, Jr. and W. Hafez, "Light-Emitting Transistor: : Light Emission From InGaP/GaAs Heterojuction Bipolar Transistors", Appl. Phys. Lett. 84, 151, Jan. 5, 2004.

* cited by examiner

SEMICONDUCTOR LASER DEVICES AND METHODS

PRIORITY CLAIMS

The present application is a continuation-in-part of U.S. patent application Ser. No. 10/861,103, filed Jun. 4, 2004 now U.S. Pat. No. 7,091,082 (which is, in turn, a continuation-in-part of U.S. patent application Ser. No. 10/646,457, filed Aug. 22, 2003, now abandoned), and the present application is also a continuation-in-part of U.S. patent application Ser. No. 10/861,320, filed Jun. 4, 2004 (which is, in turn, a continuation-in-part of U.S. patent application Ser. No. 10/646,457, filed Aug. 22, 2003, now abandoned).

GOVERNMENT RIGHTS

This invention was made with Government support under Contract Number HR0011-04-1-0034 awarded by the Defense Advanced Research Projects Agency (DARPA). The Government has certain rights in the invention.

FIELD OF THE INVENTION

This invention relates to semiconductor laser devices and methods, and also to a laser transistor and techniques for enhancing high speed optical signal generation.

BACKGROUND OF THE INVENTION

A part of the background hereof lies in the development of light emitters based on direct bandgap semiconductors such as III-V semiconductors. Such devices, including light emitting diodes and laser diodes, are in widespread commercial use.

Another part of the background hereof lies in the development of wide bandgap semiconductors to achieve high minority carrier injection efficiency in a device known as a heterojunction bipolar transistor (HBT), which was first proposed in 1948 (see e.g. U.S. Pat. No. 2,569,376; see also H. Kroemer, "Theory Of A Wide-Gap Emitter For Transistors" Proceedings Of The IRE, 45, 1535-1544 (1957)). These transistor devices are capable of operation at extremely high speeds. An InP HBT has recently been demonstrated to exhibit operation at a speed above 500 GHz (see W. Hafez, J. W. Lai, and M. Feng, Elec Lett. 39, 1475 (October 2003).

The art had contained an objective of light emission in a heterojunction bipolar transistor, and a theoretical striving for a laser transistor. However, for various reasons, an operational laser transistor has not heretofore been reported, and the achievement of same is one of the objectives hereof. Also, control of a laser transistor, to achieve advantageous high speed optical signals, is among the further objectives hereof.

SUMMARY OF THE INVENTION

In the prior copending U.S. patent application Ser. Nos. 10/646,457, 10/861,103, and 10/861,320 (hereinafter, collectively, "the prior copending applications"), all assigned to the same assignee as the present application, there is disclosed a direct bandgap heterojunction transistor that exhibits light emission from the base layer. Modulation of the base current produces modulated light emission. [As used herein, "light" means optical radiation that can be within or outside the visible range.] The prior copending applications also disclose three port operation of a light emitting HBT. Both spontaneous light emission and electrical signal output are modulated by a signal applied to the base of the HBT.

Another aspect of the prior copending applications involves employing stimulated emission to advantage in the base layer of a bipolar transistor (e.g. a bipolar junction transistor (BJT) or a heterojunction bipolar transistor (HBT), in order to enhance the speed of the transistor. Spontaneous emission recombination lifetime is a fundamental limitation of bipolar transistor speed. In an embodiment of the prior copending applications, the base layer of a bipolar transistor is adapted to enhance stimulated emission (or stimulated recombination) to the detriment of spontaneous emission, thereby reducing recombination lifetime and increasing transistor speed. In a form of this embodiment, at least one layer exhibiting quantum size effects, preferably a quantum well or a layer of quantum dots, preferably undoped or lightly doped, is provided in the base layer of a bipolar transistor. At least a portion of the base layer containing the at least one layer exhibiting quantum size effects, is highly doped, and of a wider bandgap material than the at least one layer. The at least one quantum well, or layer of quantum dots, within the higher gap highly doped material, enhances stimulated recombination and reduces radiative recombination lifetime. A two-dimensional electron gas ("2-DEG") enhances carrier concentration in the quantum well or quantum dot layer, thereby improving mobility in the base region. Improvement in base resistance permits reduction in base thickness, with attendant reduction of base transport time. As described in the prior copending applications, these advantages in speed are applicable in high speed bipolar transistors in which light emission is utilized, and/or in high speed bipolar transistors in which light emission is not utilized. In light emitting bipolar transistor devices, for example heterojunction bipolar transistors of direct bandgap materials, the use of one or more layers exhibiting quantum size effects can also be advantageous in enhancing light emission and customizing the emission wavelength characteristics of the devices.

In a further embodiment disclosed in the prior copending applications, a semiconductor laser is set forth, including: a heterojunction bipolar transistor structure comprising collector, base, and emitter of direct bandgap semiconductor materials; an optical resonant cavity enclosing at least a portion of the transistor structure; and means for coupling electrical signals with the collector, base, and emitter regions to cause laser emission from the device.

In another embodiment disclosed in the prior copending applications, a plurality of spaced apart quantum size regions (e.g. quantum wells and/or quantum dots) having different thicknesses are provided in the base region of a bipolar transistor and are used to advantageously promote carrier transport unidirectionally through the base region. As an example, the base region can be provided with several spaced apart quantum size regions of different thicknesses, with the thicknesses of the quantum size regions being graded from thickest near the collector to thinnest near the emitter. An injected electron is captured in a smaller well, tunnels into the next bigger well, and then the next bigger well, and so forth, until, at the biggest well closest to the collector, it tunnels to and relaxes to the lowest state of the biggest well and recombines. The arrangement of wells encourages carrier transport unidirectionally from emitter toward collector. Maximum recombination and light are derived from the biggest well as near as possible to the collector, which is an advantageous position, such as for optical cavity reasons. Carriers diffuse "downhill" in energy;

i.e., toward the thicker wells. The asymmetry in well size provides improved directionality and speed of carrier transport. In a light emitting HBT, light emission and device speed are both enhanced.

In accordance with an embodiment of the invention, a device and technique are set forth for high speed optical signal generation with an enhanced signal to noise ratio and control of "on" and "off" time durations utilizing the stimulated emission process for the "on" state and spontaneous emission process for the "off" state. The operating point and excitation of the transistor laser are selected to obtain cycles that each have an "on" portion of stimulated emission (laser optical output, and electrical signal output) and an "off" portion of spontaneous emission (without sensible optical output, and electrical noise).

A method is set forth in accordance with an embodiment of the invention for producing controllable light pulses, including the following steps: providing a heterojunction bipolar transistor structure comprising collector, base, and emitter regions of semiconductor materials; providing an optical resonant cavity enclosing at least a portion of the transistor structure; and coupling electrical signals with respect to said collector, base, and emitter regions, to switch back and forth between a stimulated emission mode that produces output laser pulses and a spontaneous emission mode. In a preferred embodiment, the electrical signals include an AC excitation signal, and part of each excitation signal cycle is operative to produce stimulated emission, and another part of each excitation signal cycle is operative to produce spontaneous emission. In this embodiment, during said part of the cycle, the current in the base region exceeds the stimulated emission threshold of the device, and during said other part of the cycle, the current in the base region does not exceed said threshold. Also in this embodiment, the frequency of the excitation signal controls the frequency of the output laser pulses and the relative amplitude of the excitation signal controls the pulse width of the output laser pulses. In a form of this embodiment, the AC excitation signal is provided at a frequency of at least about 1 GHz, and the pulse width of the output laser pulses is controlled to be less than about 100 picoseconds.

Further features and advantages of the invention will become more readily apparent from the following detailed description when taken in conjunction with the accompanying drawings.

DETAILED DESCRIPTION

Figure 1:
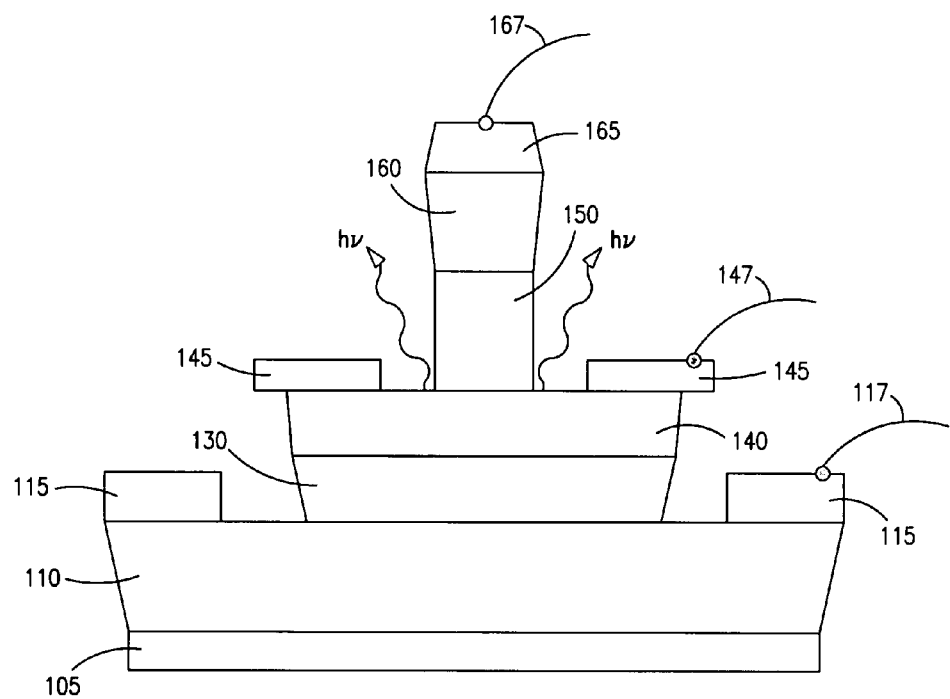
FIG. 1 is a simplified cross-sectional diagram, not to scale, of a light emitting transistor as described in a referenced copending application.

FIG. 1 illustrates a device as set forth in the above-referenced copending application Ser. No. 10/646,457. A substrate 105 has the following layers disposed thereon: subcollector 110, collector 130, base 140, emitter 150, and cap layer 160. Also shown are collector metallization (or electrode) 115, base metallization 145, and emitter metallization 165. Collector lead 117, base lead 147, and emitter lead 167 are also shown. As described in the referenced copending application, the collector layer 130 comprises 3000 Angstrom thick n-type GaAs, n=2×10$^{16}$ cm$^{-3}$, the base layer 140 comprises 600 Angstrom thick p+ carbon-doped compositionally graded InGaAs (1.4% In), p=4.5×10$^{19}$ cm$^{-3}$, the emitter layer 150 comprises 800 Angstrom thick n-type InGaP, n=5×10$^{17}$ cm$^{-3}$, and the cap layer comprises 1000 Angstrom thick n+ InGaAs, n=3×10$^{19}$ cm$^{-3}$.

As described in the referenced copending application, for conventional PN junction diode operation, the recombination process is based on both an electron injected from the n-side and a hole injected from the p-side, which in a bimolecular recombination process can be limited in speed. In the case of HBT light emission, the base "hole" concentration is so high that when an electron is injected into the base, it recombines (bimolecular) rapidly. The base current merely re-supplies holes via relaxation to neutralize charge imbalance. For a heterojunction bipolar transistor (HBT), the base current can be classified into seven components, namely: (1) hole injection into the emitter region ($i_{Bp}$); (2) surface recombination current in the exposed extrinsic base region ($i_{Bsurf}$); (3) base ohmic contact recombination current ($i_{Bcont}$); (4) space charge recombination current ($i_{Bscr}$); (5) bulk base non-radiative recombination current due to the Hali-Shockley-Reed process (HSR) ($i_{BHSR}$); (6) bulk base Auger recombination current ($i_{BAug}$); and (7) bulk base radiative recombination current ($i_{Brad}$). For a relatively efficient HBT with ledge passivation on any exposed base region, the surface recombination current can be reduced significantly. Hence, the base current and recombination lifetime can be approximated as primarily bulk HSR recombination, the Auger process, and radiative recombination. The base current expressed in the following equation (1) is then related to excess minority carriers, $\Delta n$, in the neutral base region, the emitter area, $A_E$, the charge, q, and the base recombination lifetime, $\tau_n$ as $$i_B = i_{BHSR} + i_{BAUG} + i_{Brad} = qA_E \Delta n / \tau_n \quad (1)$$

The overall base recombination lifetime, $\tau_n$, is related to the separate recombination components of Hall-Shockley-Read, $\tau_{HSR}$, Auger, $\tau_{AUG}$, and radiative recombination, $\tau_{rad}$, as $$\tau n = (1/\tau_{HSR} + 1/\tau_{AUG} + 1/\tau_{rad})^{-1} \quad (2)$$

As further described in the referenced copending application, the light emission intensity $\Delta I$ in the base is proportional to $i_{Brad}$ and is related to the minority carrier electron with the majority hole over the intrinsic carrier concentration, $(np - n_i^2)$, in the neutral base region and the rate of radiative recombination process, B, set forth in Equation (3) below, where the hole concentration can be approximated as equal to base dopant concentration, $N_B$. The radiative base current expressed in equation (3) is then related to excess minority carriers, $\Delta n$, in the neutral base region, and the base recombination lifetime, $\tau_{rad}$ as $$i_{Brad} = qA_E B(np - n_i^2) = qA_E Bnp = qA_E \Delta n(BN_B) = qA_E \Delta n / \tau_{rad} \quad (3)$$

For a high speed HBT, it is easy to predict that the base recombination lifetime can be less than half of the total response delay time. Hence, the optical recombination process in the base should be at least two times faster than the speed of the HBT. In other words, HBT speed, which can be extremely fast, is limiting.

Figure 2:
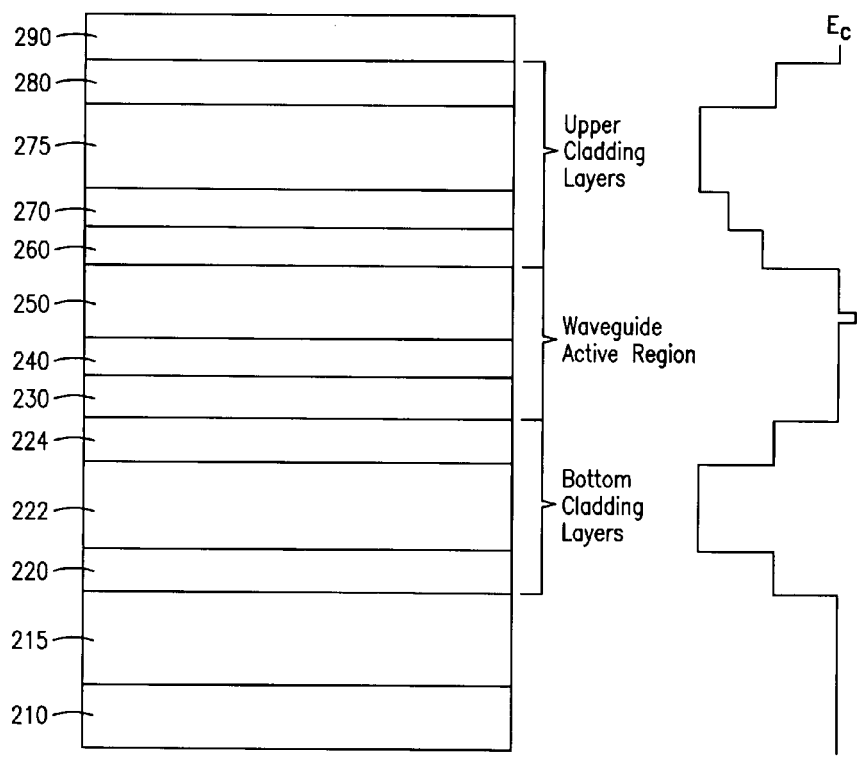
FIG. 2 shows, on the left, a diagram, not to scale, of the epitaxial layers of a crystal used for making a heterojunction bipolar light-emitting transistor (HBLET) in accordance with an embodiment of the invention and which can be used in practicing the method of the invention, and, on the right, a corresponding band diagram.

In a first illustrated embodiment, a device and data are set forth showing laser operation of an InGaP—GaAs—InGaAs heterojunction bipolar light-emitting transistor (HBLET) with AlGaAs confining layers and an InGaAs recombination quantum well incorporated in the p-type base region. The epitaxial layers of the crystal used for the HBLET laser are shown schematically in FIG. 2, with a GaAs substrate 210, a 4000 Å n-type heavily doped GaAs buffer layer 215, followed by a 600 Å n-type Al$_{0.40}$Ga$_{0.60}$As layer 220, a 3500 Å n-type Al$_{0.98}$Ga$_{0.02}$As layer 222, and a 400 Å n-type Al$_{0.40}$Ga$_{0.60}$As layer 224 forming the bottom cladding layers. These layers are followed by a 400 Å n-type sub-collector layer 230, then a 200 Å In$_{0.49}$Ga$_{0.51}$P etch stop layer (not shown), a 650 Å undoped GaAs collector layer 240, and a 940 Å p-type GaAs base layer 250 (the active layer), which includes also (in the base region) a 120 Å InGaAs QW (designed for $\lambda \approx 980$ nm). The epitaxial HBLET laser structure was completed with the growth of the upper cladding layers, which included a 1200 Å n-type In$_{0.49}$Ga$_{0.51}$P wide-gap emitter layer 260, a 300 Å n-type Al$_{0.70}$Ga$_{0.30}$As oxidation buffer layer 270, a 3500 Å n-type Al$_{0.98}$Ga$_{0.02}$As oxidizable layer 275 (see J. M. Dallesasse, N. Holonyak, Jr., A. R. Sugg, T. A. Richard, and N. El-Zein, Appl. Phys. Lett. 57, 2844 (1990)), and a 1000 Å n-type Al$_{0.40}$Ga$_{0.60}$As layer 280. Finally, the HBLET laser structure was capped with a 1000 Å heavily doped n-type GaAs contact layer 290.

The HBLET laser fabrication was performed by first patterning 6 µm protective SiN$_4$ stripes on the crystal. The top n-type Al$_{0.98}$Ga$_{0.02}$As oxidizable layer was then exposed by wet etching (1:8:160 H$_2$O$_2$:H$_2$SO$_4$:H$_2$O) to form a ~6 µm emitter mesa. Next, a wide 150 µm protective photoresist (PR) stripe was placed over the emitter mesa and the unprotected Al$_{0.98}$Ga$_{0.02}$As layer was completely removed (1:4:80 H$_2$O$_2$:H$_2$SO$_4$:H$_2$O), revealing the In$_{0.49}$Ga$_{0.51}$P wide-gap emitter layer. The protective PR stripe was then removed and the sample was oxidized for 7.5 min at 425° C. in a furnace supplied with N$_2$+H$_2$O, resulting in a ~1.0 µm lateral oxidation which formed ~4 µm oxide-defined apertures in the 6 µm emitter mesa (see, again, J. M. Dallesasse, N. Holonyak, Jr., A. R. Sugg, T. A. Richard, and N. El-Zein, supra (1990); S. A. Maranowski, A. R. Sugg, E. I. Chen, and N. Holonyak, Jr., Appl. Phys. Lett. 63, 1660 (1993)). The samples were annealed (in N$_2$) at 430° C. for 7 minutes to reactivate p-dopants before the protective SiN$_4$ was removed by plasma (CF$_4$) etching. A 100 µm PR window was formed over the emitter mesa and oxide layer, and Au—Ge/Au was deposited over the sample to form metal contact. After lift-off of the photoresist (PR) to remove excess metal, the In$_{0.49}$Ga$_{0.51}$P layer was removed using a wet etch (4:1 HCl:H$_2$O), exposing the p-type GaAs base layer. An 80 µm wide PR window was then patterned ~15 µm away from the emitter mesa edge, and Ti—Pt—Au was evaporated for contact to the base. Another lift-off process was then performed to remove excess base contact metal. A 150 µm PR window was then patterned ~6 µm away from the base contact. The GaAs base and collector layers were removed using a selective etch (4:1 C$_6$H$_8$O$_7$:H$_2$O$_2$), and the In$_{0.49}$Ga$_{0.51}$P etch-stop layer was removed by a wet etch (16:15 HCl:H$_2$O), exposing the heavily doped n-type GaAs sub-collector layer. Au—Ge/Au metal alloy was evaporated over the sample for contact to the exposed sub-collector layer, and another lift-off process was performed to remove excess metal. The sample was then lapped to a thickness of ~75 µm and the contacts annealed. The HBLET samples were cleaved normal to the emitter stripes to form Fabry-Perot facets, and the substrate side of the crystal was alloyed onto Cu heat sinks coated with In.

Figure 3:
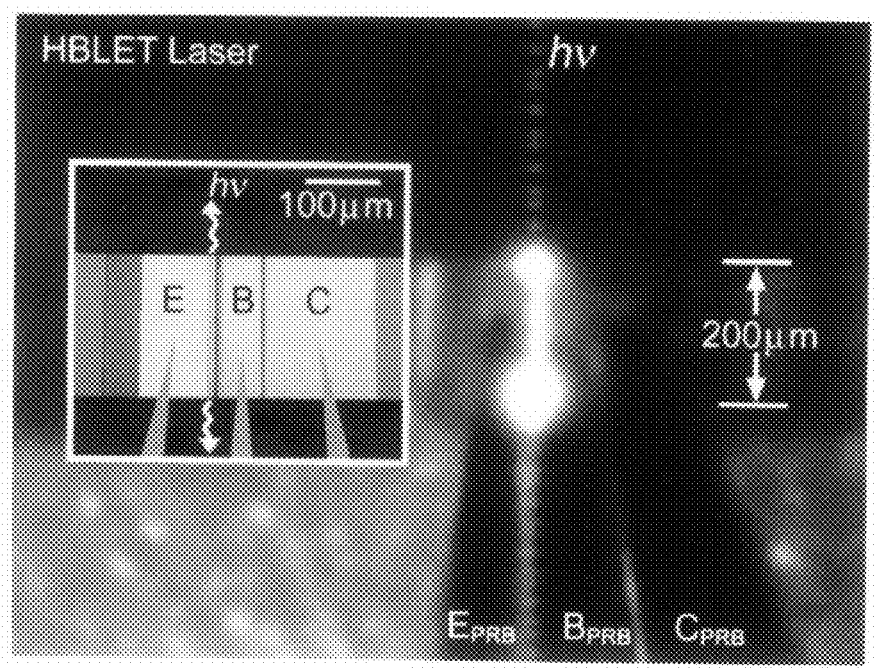
FIG. 3, shows, on the left, a processed, metallized, and cleaved HBLET laser (top view) as made using the crystal of FIG. 2 and, on the right, an image of the operating device obtained with a video CCD detector.

A processed, metallized, and cleaved HBLET laser (top view) is shown on the left in FIG. 3. The contact probes on the emitter (E), base (B), and collector (C) are shown schematically resembling the actual probes (E$_{PRB}$, B$_{PRB}$, and C$_{PRB}$) on the operating device at the right. The image on the right was obtained with a video CCD detector and shows (hν) the device laser beam (photons) scattered from a Cu platform located slightly lower than the laser crystal, which, as shown, has a ~200 μm spacing between the cleaved Fabry-Perot facets. Current and bias voltage (common emitter operation) were provided using a Tektronix Model 370 high resolution curve tracer connected to the HBLET by the three probes labeled $E_{PRB}$, $B_{PRB}$, and $C_{PRB}$ in FIG. 3. The HBLET laser was operated ~200 K in a dry $N_2$ environment.

Figure 4:
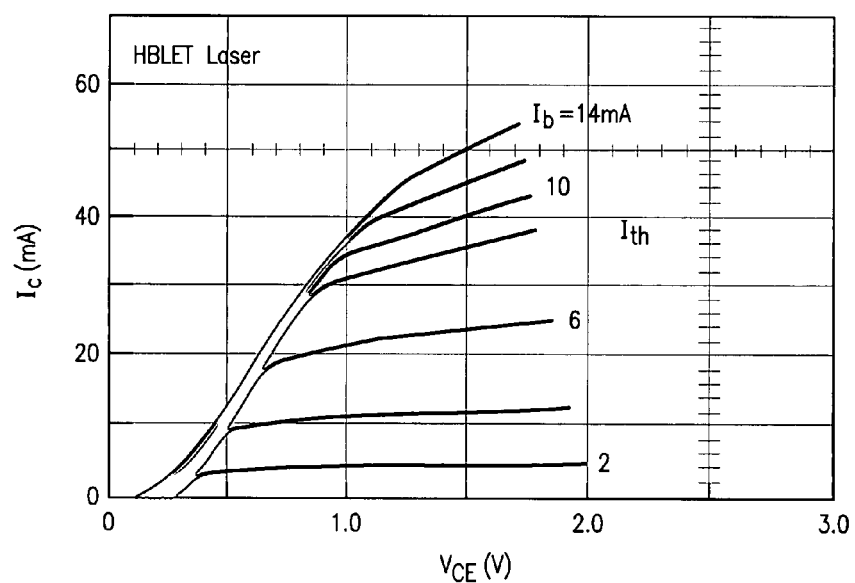
FIG. 4 shows the transistor I-V curves of another HBLET laser with ~260 μm spacing between the Fabry-Perot facets.

The transistor I-V curves of another HBLET laser with ~260 μm spacing between the Fabry-Perot facets are shown in FIG. 4. As the base current, $I_b$, is increased in 2 mA intervals from 0 to 8 mA, the usual increase of differential current gain is observed, $\beta=\Delta I_c/\Delta I_b$, in this case from $\beta \sim 2$ at lower current to 6.5 at higher current. Light versus $V_{CE}$ measurements ($I_b$ constant, data not shown) indicate that radiative recombination improves as $V_{CE}$ increases and then decreases at the onset of reverse breakdown. Near $I_b$=8 mA, and as $V_{CE}$ is increased, however, stimulated recombination (stimulated emission) becomes significant, and the HBLET operates both as a laser and a transistor but with a distinct decrease in the current gain β. Beyond threshold, $I_b$ equal to or greater than $I_{th}$-8 mA, the differential gain β decreases from 6.5 to a nearly constant value of 2.5 ($\alpha=\beta/(\beta+1)=I_c/I_e$=0.71). Since β can be approximated as the simple ratio $\tau_n/\tau_t$ (see B. G. Streetman and S. Banerjee, Solid State Electronic Devices, 5$^{th}$ ed. (Pearson, N.J., 2004), p. 328), where $\tau_t$ is the average (carrier) base transit time (which is almost the same below and above threshold) and $\tau_n$ is the average electron lifetime in the base, the electron lifetime is reduced by a factor of 2.6 because of the stimulated recombination of the carriers collected in the 120-Å QW. The QW operates as a unique pseudo-collector (see E. A. Rezek, H. Shichijo, B. A. Vojak, and N. Holonyak, Jr., Appl. Phys. Lett. 31, 534 (1977)), and can be adjusted to govern the base recombination and thus both the optical output and transistor gain (β). It can be noted for comparison that at room temperature there was observed (data not shown) a differential current gain β of 10 at $I_b$=2 mA and 30 at 8 mA (or current transfer ratio, $\alpha=I_c/I_e$ of 0.91 and 0.96).

Figure 5:
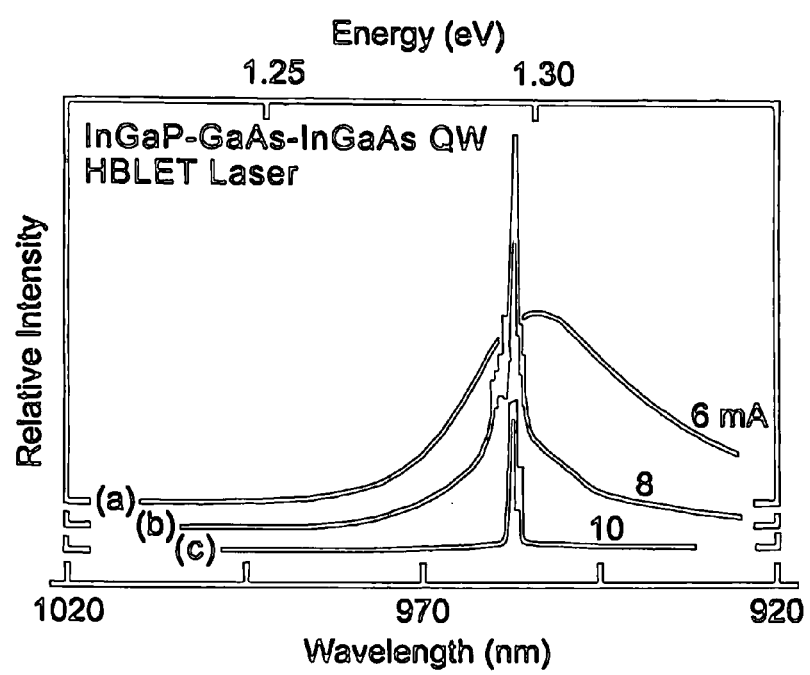
FIG. 5 shows, in quasi-continuous operation (88% duty cycle at 60 Hz), the recombination radiation spectra of the HBLET device of FIG. 3, but with slightly increased voltage bias $V_{CE}$ to increase the reverse bias on the base-collector junction.

FIG. 5 shows, in quasi-continuous operation (88% duty cycle at 60 Hz), the recombination radiation spectra of the HBLET device of FIG. 3, but with slightly increased voltage bias $V_{CE}$ to increase the reverse bias on the base-collector junction. At (a) $I_b$=6 mA, the HBLET recombination radiation exhibits a peak wavelength of 954 nm and a spectral width of ~280 Å. At (b) $I_b$=8 mA, the onset of stimulated emission can be seen with distinct spectral narrowing and mode development. At (c) $I_b$=10 mA the laser modes are fully developed (λ=958 nm), clearly indicating transistor laser operation, which is evident also in FIG. 3. It can be noted that the 200 μm long HBLET laser of FIG. 3 (right side) was operated with pulsed base current (1% duty cycle at 1 MHz) to prevent saturation of the Si-CCD viewing camera.

The described results demonstrate that an HBLET, suitably modified with a resonator cavity and a recombination QW (or QWs) in the p-type base (a pseudo-collector, a second collector), can be operated simultaneously as a laser and transistor with gain $\beta=\Delta I_c/\neq I_b > 1$. At laser threshold the transistor gain decreases sharply, but still supports three-port operation (electrical input, electrical output, and optical output).

In the description of the foregoing embodiment, it is shown that a heterojunction bipolar light emitting transistor (HBLET) having certain features, can support stimulated recombination and laser operation. In the following further embodiment, a three-port transistor laser, having certain features, exhibits microwave operation and optical modulation. In this embodiment, the epitaxial layers of the crystal used for the HBLET laser include of a 100 Å n-type heavily doped GaAs buffer layer, followed by a 630 Å n-type $Al_{0.40}Ga_{0.60}As$ layer, a 4000 Å n-type $Al_{0.98}Ga_{0.02}As$ layer, and a 250 Å n-type $Al_{0.40}Ga_{0.60}As$ layer forming the bottom cladding layers. These layers are followed by a 300 Å n-type sub-collector layer, then a 150 Å $In_{0.49}Ga_{0.51}P$ etch stop layer, a 600 Å undoped GaAs collector layer, and a 850 Å p-type GaAs base layer, which includes also (in the base region) a 120 Å InGaAs QW (designed for λ≈980 nm). The epitaxial HBLET laser structure is completed with the growth of the upper cladding layers, which include a 600 Å n-type $In_{0.49}Ga_{0.51}P$ wide-gap emitter layer, a 50 Å n-type GaAs buffer layer, a 200 Å n-type $Al_{0.35}Ga_{0.65}As$ oxidation buffer layer, a 200 Å n-type $Al_{0.80}Ga_{0.20}As$ oxidation buffer layer, a 4000 Å n-type $Al_{0.95}Ga_{0.05}As$ oxidizable layer, a 300 Å n-type $Al_{0.80}Ga_{0.20}As$ layer, and a 500 Å n-type $Al_{0.35}Ga_{0.65}As$ layer. Finally, the HBLET laser structure is capped with a 1000 Å heavily doped n-type GaAs contact layer.

The HBLET laser fabrication was performed by first patterning 8 μm protective $SiN_4$ stripes on the crystal. The top n-type $Al_{0.98}Ga_{0.02}As$ oxidizable layer was then exposed by wet etching (1:8:160$H_2O_2$:$H_2SO_4$:$H_2O$) to form a ~6 μm emitter mesa. Next, 10 μm and 50 μm (40 μm apart) photoresist (PR) windows were formed with the emitter mesa placed between the two windows and ~5 μm away from the 10 μm window. The unprotected $Al_{0.98}Ga_{0.02}As$ layer was then completely removed (1:4:80$H_2O_2$:$H_2SO_4$:$H_2O$), revealing the $In_{0.49}Ga_{0.51}P$ wide-gap emitter layer. The protective PR stripe was dissolved and the sample was oxidized for 6.5 min at 425° C. in a furnace supplied with $N_2$+$H_2O$, resulting in ~1.0 μm lateral oxidation which forms ~4 μm oxide-defined apertures in the 6 μm emitter mesa. (Again, see J. M. Dallesasse, N. Holonyak, Jr., A. R. Sugg, T. A. Richard, and N. El-Zein, Appl. Phys. Lett. 57, 2844 (1990); S. A. Maranowski, A. R. Sugg, E. I. Chen, and N. Holonyak, Jr., Appl. Phys. Lett. 63, 1660 (1993)). The samples were annealed (in $N_2$) at 430° C. for 6.5 minutes to reactivate p-dopants before the protective $SiN_4$ is removed by plasma ($CF_4$) etching. The remaining InGaP emitter was selectively etched using HCl. The base-collector contact layers were then exposed by a selective wet etch (4:1 $C_6H_8O_7$:$H_2O_2$) for GaAs and InGaAs, and HCl for $In_{0.49}Ga_{0.51}P$. Then, a 50 μm PR window was formed over the 10 μm base contact window and the oxidized $Al_{0.98}Ga_{0.02}As$ layer. A 1 μm thick Pd—Pt—Au p-type ohmic contact was deposited on top of the partially exposed base layer to form the base metal contact (followed by a lift-off process). Next, 30 μm and 50 μm (5 μm apart) PR windows were opened for the emitter and collector metal contact deposition, and 1 μm thick n-type contact AuGe—Ni—Au metal alloy was deposited on the crystal and another lift-off process was performed to remove excess metal. The sample was then lapped to a thickness of ~100 μm and annealed. The HBLET samples were cleaved normal to the emitter stripes to form Fabry-Perot facets, and the substrate side of the crystal was alloyed onto Cu heat sinks coated with indium.

Figure 6:
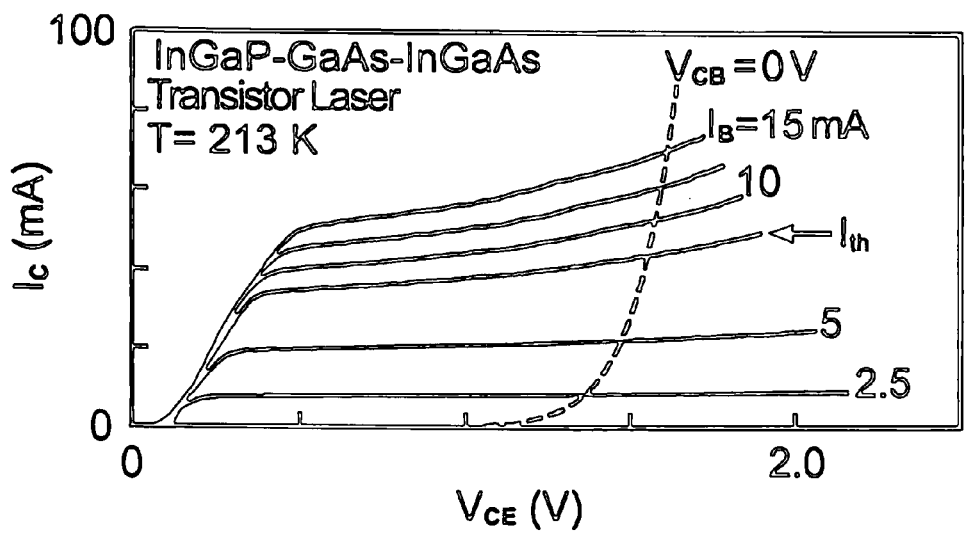
FIG. 6 shows the transistor $I_C$ versus $V_{CE}$ family of curves (at 213 K) of a 450 μm HBLET of another device in accordance with an embodiment of the invention and which can be used in practicing embodiments of the method of the invention.

The transistor $I_C$ versus $V_{CE}$ family of curves (at 213 K) of a 450 μm HBLET of this embodiment is shown in FIG. 6. As the base current $I_B$ is increased in 2.5 mA intervals from 0 to 15 mA, the current gain ($\beta_{dc}=I_C/I_B$) increases to ~5.65 for $I_B \leq I_{th}$ and then decreases to ~4.5 for $I_B \geq I_{th}$. At $I_B$=7.5 mA one observes in FIG. 6 a negative slope in the differential or small signal $\beta(\beta_{ac}=\Delta I_C/\Delta I_B)$ associated with a transistor in laser operation, as described in conjunction with the previous embodiment. The transistor's $V_{BE}$ curve is superimposed on the family of $I_C$ versus $V_{CE}$ curves to indicate the zero base-collector bias point, the boundary $V_{CB}=0$. From FIG. 6 and by observing the gain characteristic, it can be seen that the transistor operates as a laser over a wide range of $V_{CE}$ (beyond $V_{CB}=0$). Light versus base current measurements (data not shown) indicate small variation in laser light intensity when the transistor operates in the saturation mode (constant $I_C$), and decreases at high reverse bias and the onset of heating.

Figure 7:
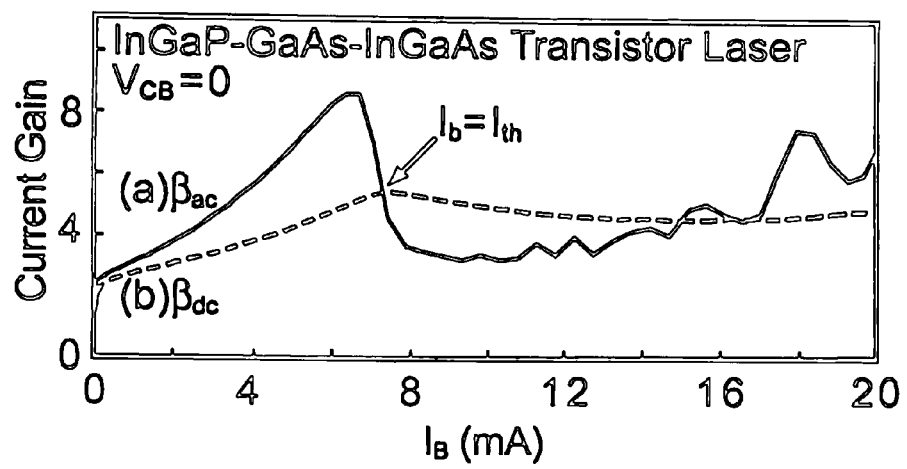
FIG. 7 shows, in the curves (a) and (b), respectively, the small signal current gain $\beta_{ac}=\Delta I_C/\Delta I_B$ and current gain $\beta_{dc}=I_C/I_B$ for $V_{CB}=0$ for the device whose $I_c$ curves are shown in FIG. 6.

A novel technique is used for determining the threshold current of a transistor laser that is based on the electrical gain of the transistor. This eliminates the need to have an additional external feedback system (photodetector) to verify that the device is operating as a laser. The small signal current gain $\beta_{ac}=\Delta I_C/\Delta I_B$ and current gain $\beta_{dc}=I_C/I_B$ for $V_{CB}=0$ are shown by curves (a) and (b) of FIG. 7. From curve (a) it can be observed that the small signal gain increases as $I_B$ increases and decreases sharply at the onset of stimulated emission, or for amplified spontaneous emission ($I_B=6.7$ mA, $\beta_{ac}=8.6$). The peak of curve (b) in FIG. 7 can be defined as the threshold current of the transistor laser ($I_B=I_{th}=7.4$ mA). The transistor laser operation is fully developed when $\beta_{ac}$ reaches a minimum ($\beta_{sac}=3.7$) at $I_B\approx 7.9$ mA. This method of threshold current measurement is verified by comparison with standard light versus intensity (L-I) measurements (data not shown) and from visual observation of the laser diffraction pattern using an infrared CCD camera. It is consistent also with spectral narrowing.

Figure 8:
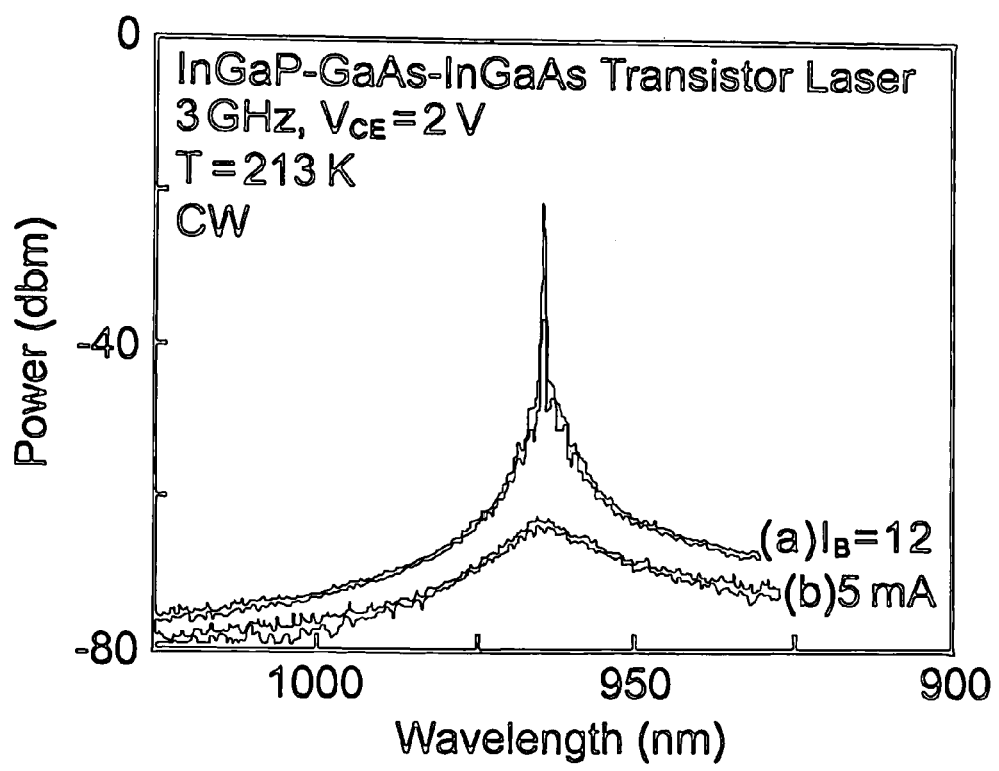
FIG. 8 shows (at 213 K) the laser operation (curve (a)) and spontaneous spectrum (curve (b)) power spectra of the transistor laser biased at $V_{CE}=2$ V and operating at 3 GHz.
Figure 9:
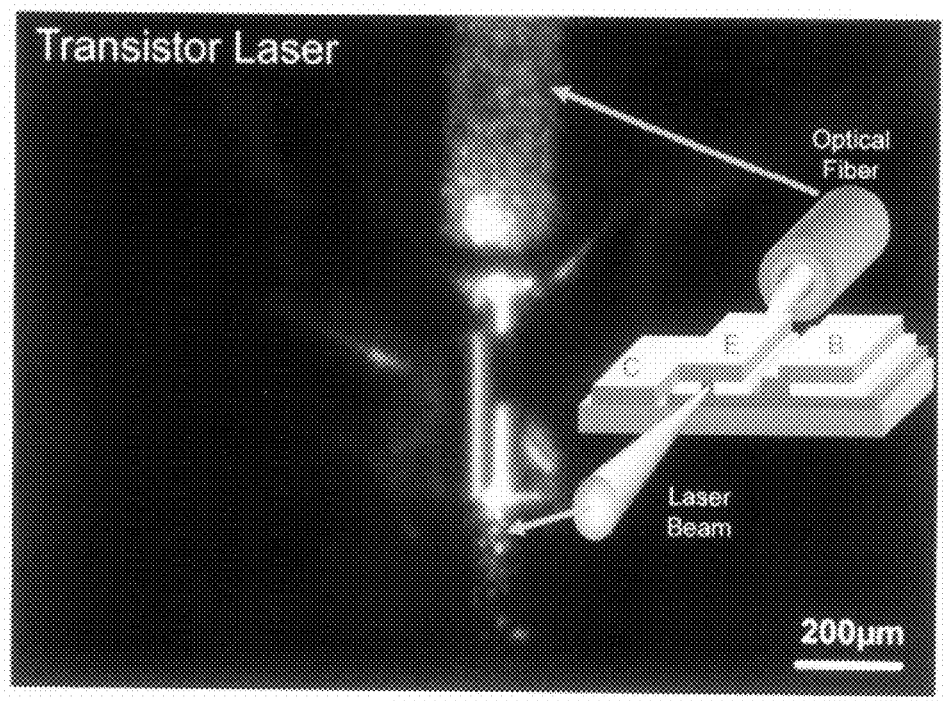
FIG. 9 shows a picture of the transistor laser in operation at 3 GHz, captured using a CCD camera.

FIG. 8 shows (at 213 K) the laser operation (curve (a)) and spontaneous spectrum (curve (b)) of the transistor laser of the present embodiment biased at $V_{CE}=2$ V and operating at 3 GHz. The input voltage waveform is generated using a clock signal from an HP70841A pattern generator which has a maximum clock signal of 3 GHz. The output measurements were made using an HP70951B optical spectrum analyzer. A maximum power level of −63.4 dBm was measured at $\lambda=966.5$ nm for the spontaneous emission, and for laser operation a power output of −21.44 dBm ($\lambda=964.4$ nm). The small output power of the transistor laser was attributed to weak fiber coupling. Additional free space measurements have yielded powers at least 8 times greater. A picture of the transistor laser in operation at 3 GHz, captured using a CCD camera, is shown in FIG. 9. The light emission from the front Fabry-Perot facet was coupled (upward in FIG. 9) into the optical fiber, which was connected directly into the input of the optical spectrum analyzer.

Figure 10:
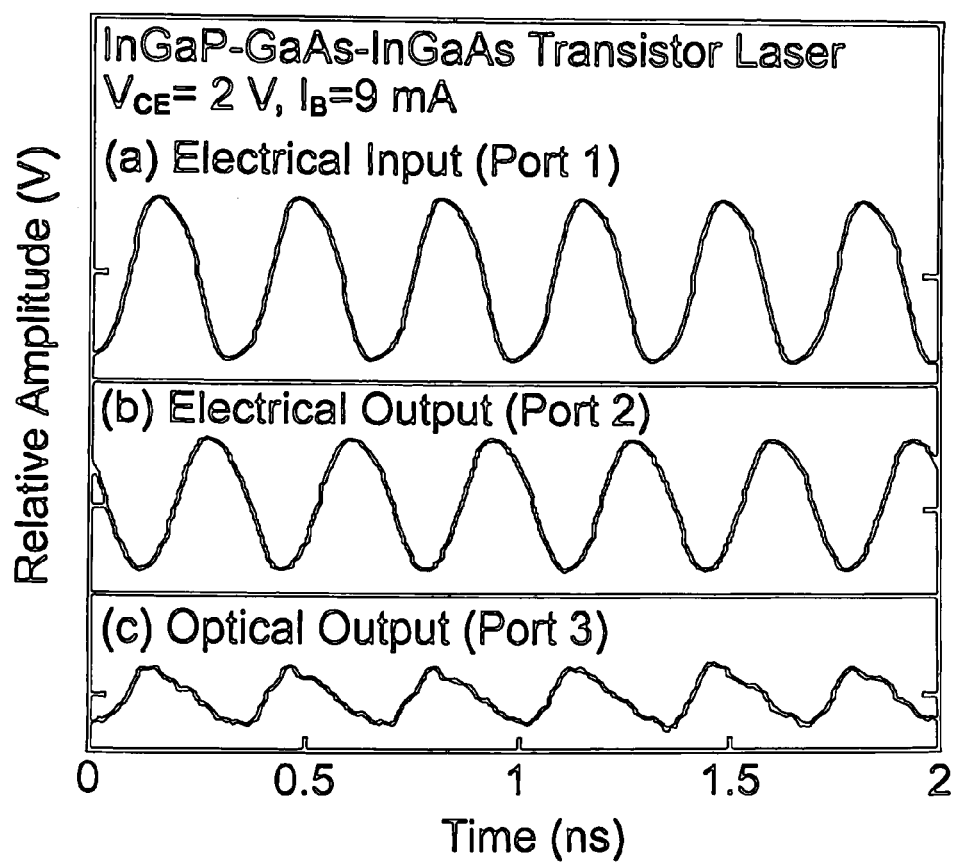
FIG. 10 shows, in traces (a), (b) and (c), respectively, the input signal modulated at 3 GHz, and the corresponding electrical and optical outputs.

A signal generator, a wideband detector, a power meter and a digital oscilloscope were used for the three-port (electrical input, electrical output and optical output) direct modulation characterization of the transistor laser. A cold station equipped with a pair of 40 GHz ground-signal microwave probes was used to enable measurements at 213 K. The HBLET, with ~450 μm spacing between the Fabry-Perot facets, was biased in the normal operating mode ($V_{CE}=2$ V and $I_B=9$ mA), and a small signal sinusoidal voltage waveform with a peak-to-peak amplitude of 0.75 V was supplied to the base (input port) of the device. The input voltage waveform was generated using a clock signal from the HP70841A pattern generator (maximum clock signal of 3 GHz), and the electrical output collector-emitter voltage waveform was measured using a 20 GHz digital sampling oscilloscope. The complementary output of the input waveform clock signal was measured at a second separate channel of the oscilloscope. The output of the transistor laser was coupled into a multimode fiber probe with a core diameter of 25 μm. The laser signal was fed into a high-speed (10 Gb/s) wideband (400 to 1700 nm) InGaAs detector. The detector output voltage, base input voltage, and collector output voltage were all displayed simultaneously on a four channel sampling oscilloscope. The input signal modulated at 3 GHz (top trace) and the corresponding electrical and optical outputs are shown in FIGS. 10 (a), (b) and (c), respectively. When the 3 GHz base current is held (decreased) below the threshold current, the optical output waveform was not observed, making evident, in contrast, that stimulated emission defines a much stronger laser output signal.

In accordance with an embodiment of the invention, a device and technique are set forth for high speed optical signal generation with an enhanced signal to noise ratio and control of "on" and "off" time durations utilizing the stimulated emission process for the "on" state and spontaneous emission process for the "off" state. The operating point and excitation of the transistor laser are selected to obtain cycles that each have an "on" portion of stimulated emission (laser optical output, and electrical signal output) and an "off" portion of spontaneous emission (without optical output, and electrical noise).

Figure 11:
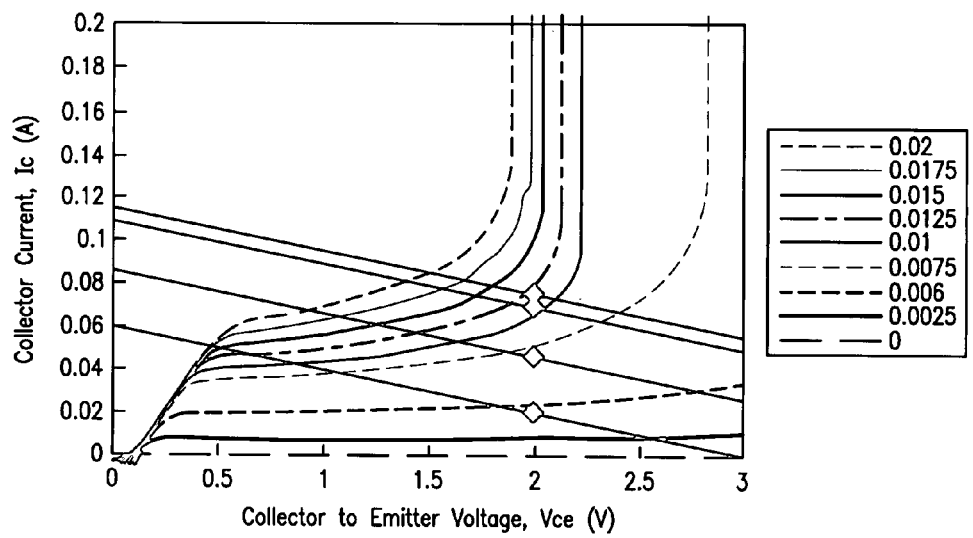
FIG. 11 shows the output collector I-V characteristics of an HBLET. For the base current below laser threshold $I_{bth}=0.744$ mA, the optical recombination process yields spontaneous emission (low optical output). For base current above laser threshold the optical recombination process is stimulated (higher optical output power).
Figure 12:
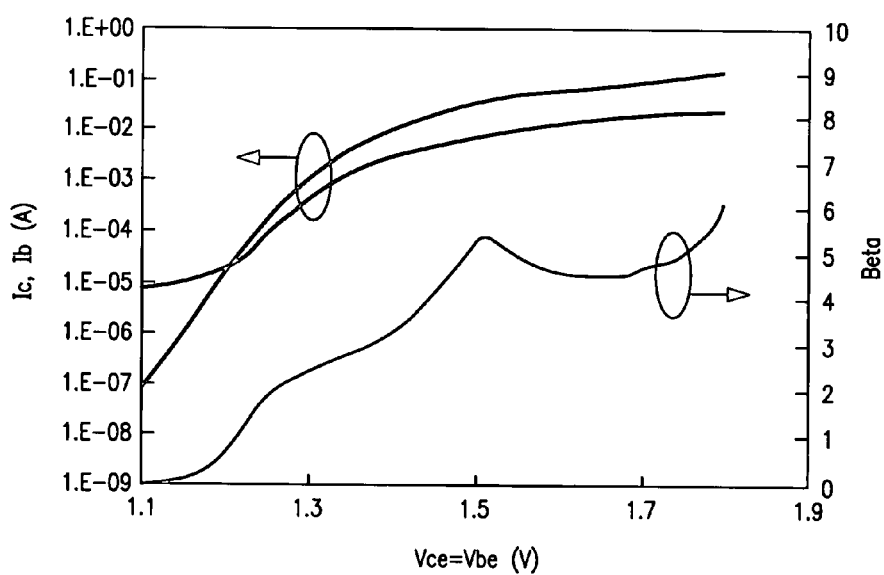
FIG. 12 shows a Gummel plot of base current and collector current with Vce=Vbe and Vbc=0V. The current gain beta increases (spontaneous emission), and the beta decreases when laser operation of the HBLET starts, since the recombination process for stimulated emission become "faster".
Figure 13A:
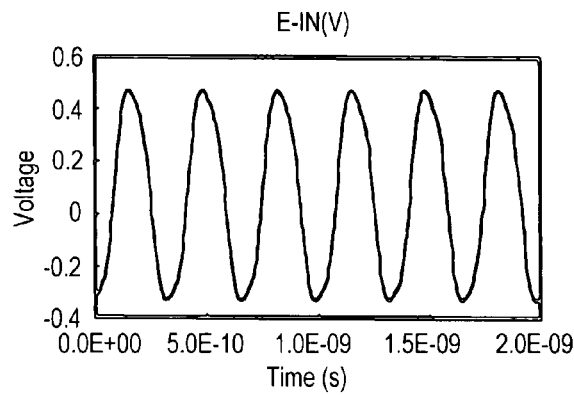
FIGS. 13(a), 13(b), 13(c), and 13(d) show, respectively, the input voltage, output voltage, optical output, and optical power spectrum for a laser transistor device operated in a stimulated emission mode.
Figure 13B:
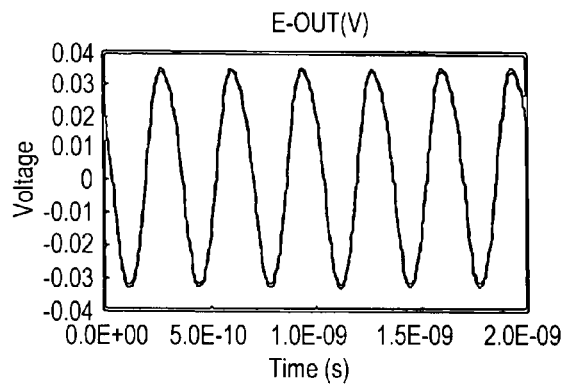
Figure 13C:
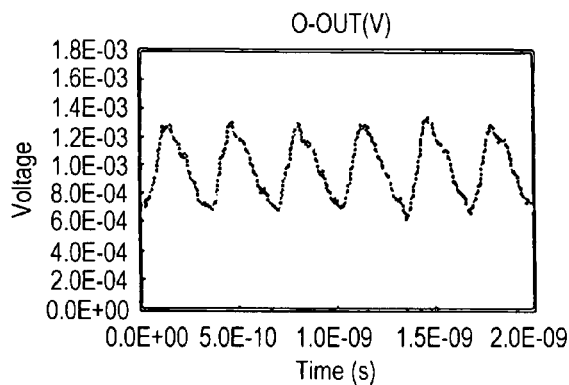
Figure 13D:
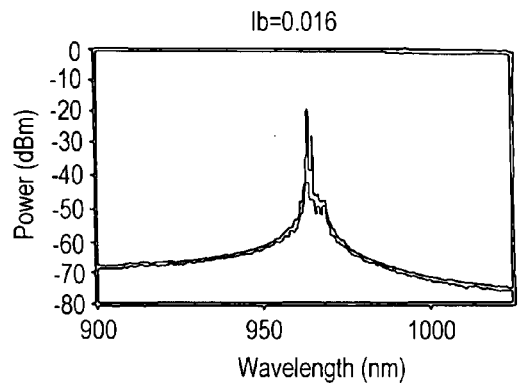

The transistor I-V curves of an HBLET laser with ~450 μm spacing between the Fabry-Perot facets are shown in FIG. 11. At a base current $I_b=0.744$ mA, the HBLET reaches laser threshold and changes transistor gain, $\beta=DI_c/dI_b$, from $\beta=5.5$ to 4.5 or ($\alpha=\beta/(\beta+1)=0.85\rightarrow 0.81$). As above noted, an HBLET transistor laser has an important feature in the I-V curves in the transition from spontaneous emission to stimulated emission. FIG. 12 shows a Gummel plot of base current and collector current with Vce=Vbe and Vbc=0V. The current gain beta increases (spontaneous emission), and the beta decreases when laser operation of the HBLET starts, since the recombination process for stimulated emission become "faster".

Experiments were conducted on the transistor laser in the common emitter configuration with 3 GHz modulation of the electrical input (controllable in frequency and amplitude) at the base terminal of the device.

A mode of operation termed a stimulated emission mode had, for example, the following initial operating parameters: $V_{be}=1.67$ V, $V_{ce}=2$ V, $I_b=16$ mA and $I_c=69.2$ mA. As expected, in the stimulated emission mode (i.e., with the input consistently at a level above the threshold for stimulated emission), the electrical input and output, and the optical output as shown in graphs 13(a), 13(b), and 13(c), respectively, of FIG. 11, are similar to the corresponding graphs 10(a), 10(b) and 10(c) of FIG. 10 for a similar device, and the graph 13(d) of the laser power spectrum is similar to the corresponding graph of FIG. 8 for the similar device.

Figure 14A:
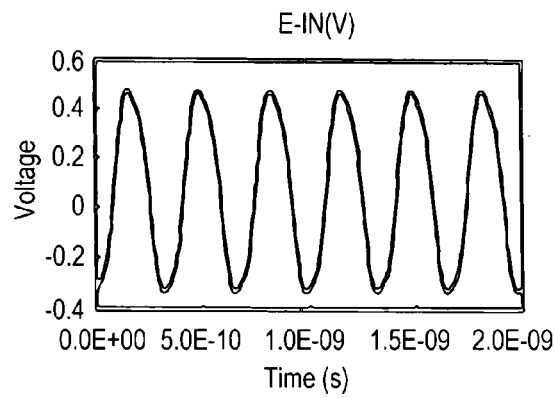
FIGS. 14(a), 14(b), and 14(c), show, respectively, the input voltage, optical output, and optical power spectrum for a laser transistor device operated in a spontaneous emission mode.
Figure 14B:
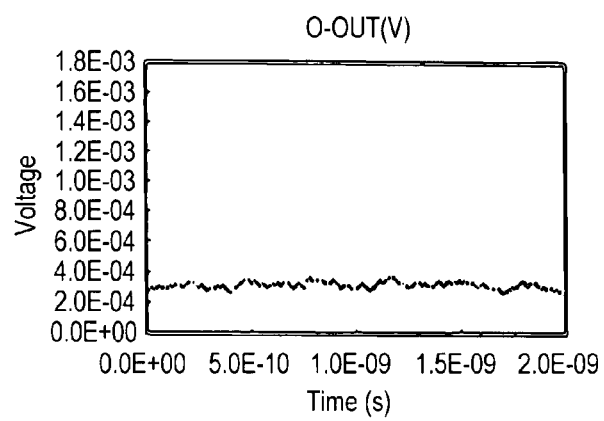
Figure 14C:
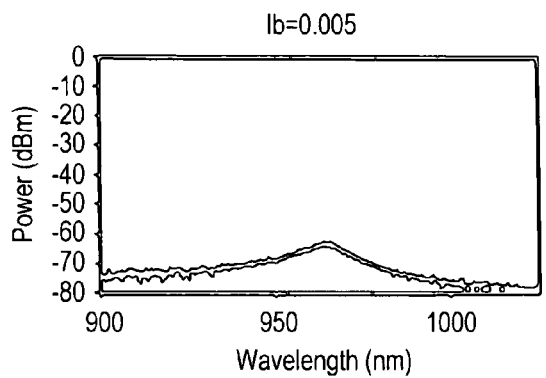
Figure 15A:
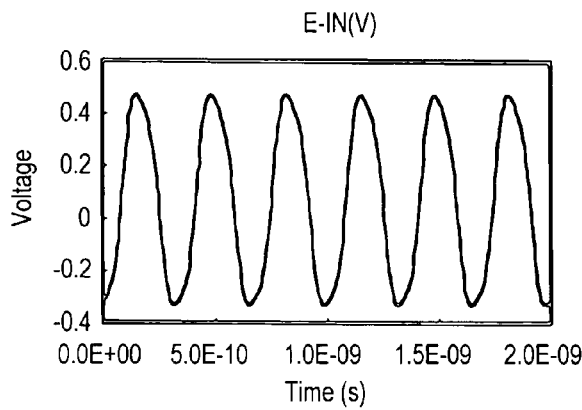
FIGS. 15(a), 15(b), 15(c), and 15(d) show, respectively, the input voltage, output voltage, optical output, and optical power spectrum for a laser transistor device operated in a near-threshold mode.
Figure 15B:
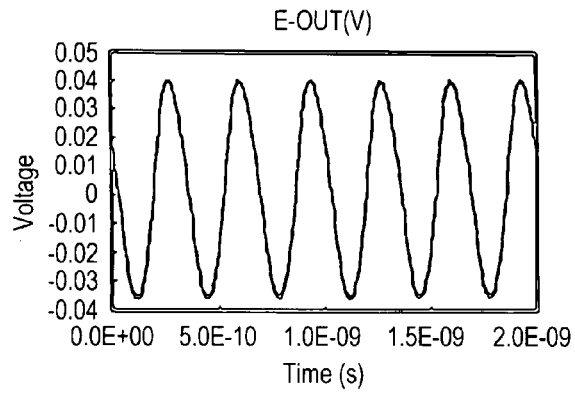
Figure 15C:
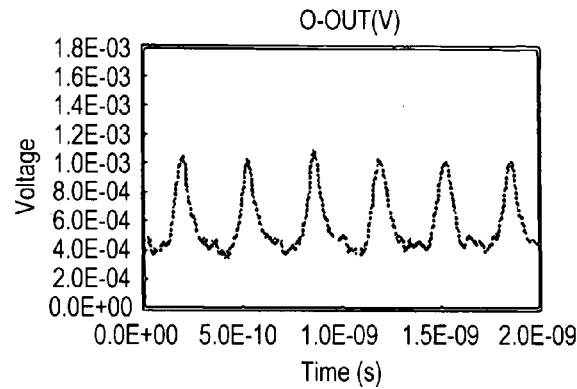
Figure 15D:
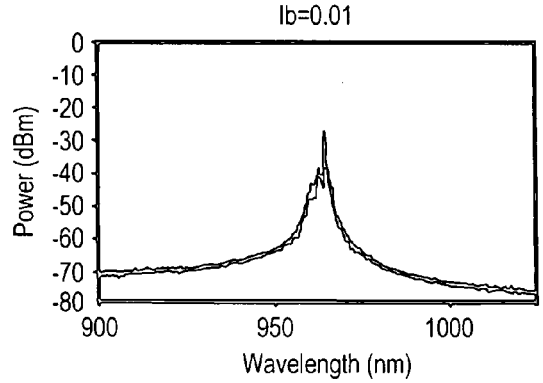

A mode of operation termed a spontaneous emission mode had, for example, the following initial operating parameters: $V_{be}=1.47$ V, $V_{ce}=2$ V, $I_b=5$ mA, and $I_c=19.84$ mA. The graphs of FIG. 14 show results for the spontaneous emission mode (i.e., with the input consistently at a level below the threshold for stimulated emission), the graph 14(a) showing the sinusoidal electrical input, the graph 14(b) showing the optical signal output, which is seen to be background noise characteristic of spontaneous emission, and the graph 14(c) showing the optical output power spectrum of the spontaneous emission mode.

A mode of operation termed a near-threshold mode had, for example, the following initial operating parameters: $V_{be}=1.57$ V, $V_{ce}=2$ V, $I_b=10$ mA, and $I_c=46.2$ mA. The graphs of FIG. 15 show results for the near-threshold mode (i.e., with each cycle of the sinusoidal input signal having an "on" portion during which the base current exceeds the threshold for stimulated emission, and an "off" portion during which the base current is below the threshold for stimulated emission). The graphs 15(a) and 15(b) again show, respectively, the electrical input and output signals. The graph 15(c) shows the optical output, which is seen to have a stimulated emission laser pulse (during the part of the cycle when the base threshold current is exceeded) and spontaneous emission (during the part of the cycle when the base threshold current is not exceeded). In this case, for the 3 GHz input signal (which, it is evident, can be readily exceeded, within the capability of the present device, with better test equipment), the laser pulses, for the conditions set forth, have a half-power pulse width of less than about 100 picoseconds. By adjusting the relative signal amplitude (e.g. by controlling bias and/or the AC signal amplitude and/or load), the pulse width can be advantageously controlled. The graph 15(d) shows the optical output power spectrum for this case.

Figure 16:
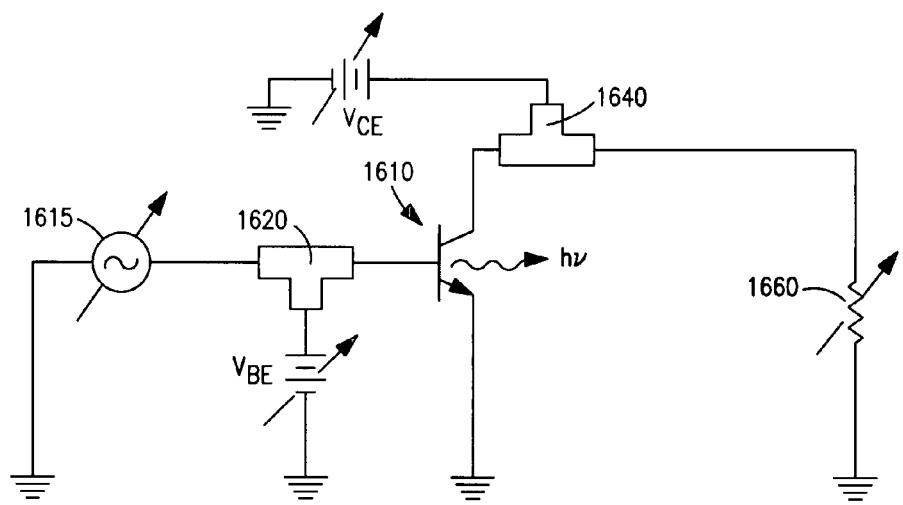
FIG. 16 is a schematic diagram of an example of a circuit that can be used to operate a light emitting transistor in accordance with an embodiment of the invention.

FIG. 16 is a diagram of an example of a circuit that can be used to operate the light emitting transistor (LET) 1610, under various conditions, including conditions employed in examples of embodiments hereof. In this example, a controllable oscillator 1615 is coupled to the base terminal of the LET via a bias tee 1620, and the middle branch of the bias tee 1620 is coupled to a controllable bias voltage $V_{BE}$. The emitter terminal is coupled to ground reference potential and the collector terminal is coupled, via a bias tee 1640, to a variable load resistor 1660. The middle branch of the bias tee 1640 is coupled to controllable bias potential $V_{CE}$.

Figure 17:
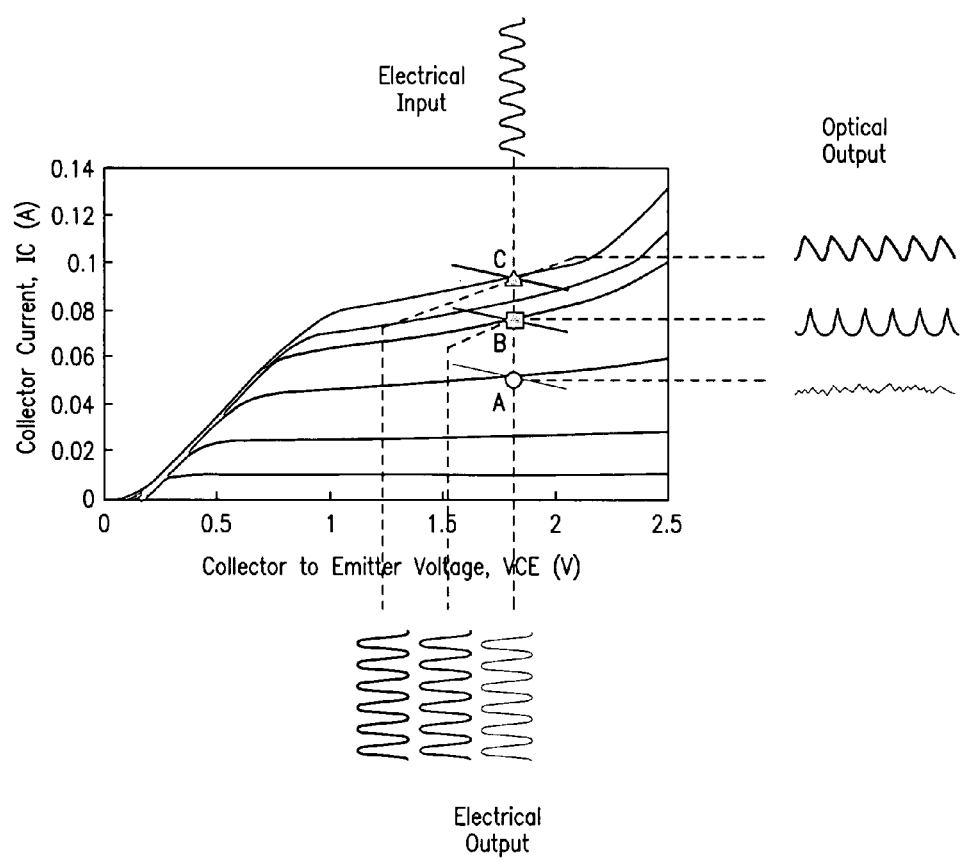
FIG. 17 shows output collector I-V characteristics of an HBLET, and signals that result when operated at different operating points.
Figure 18:
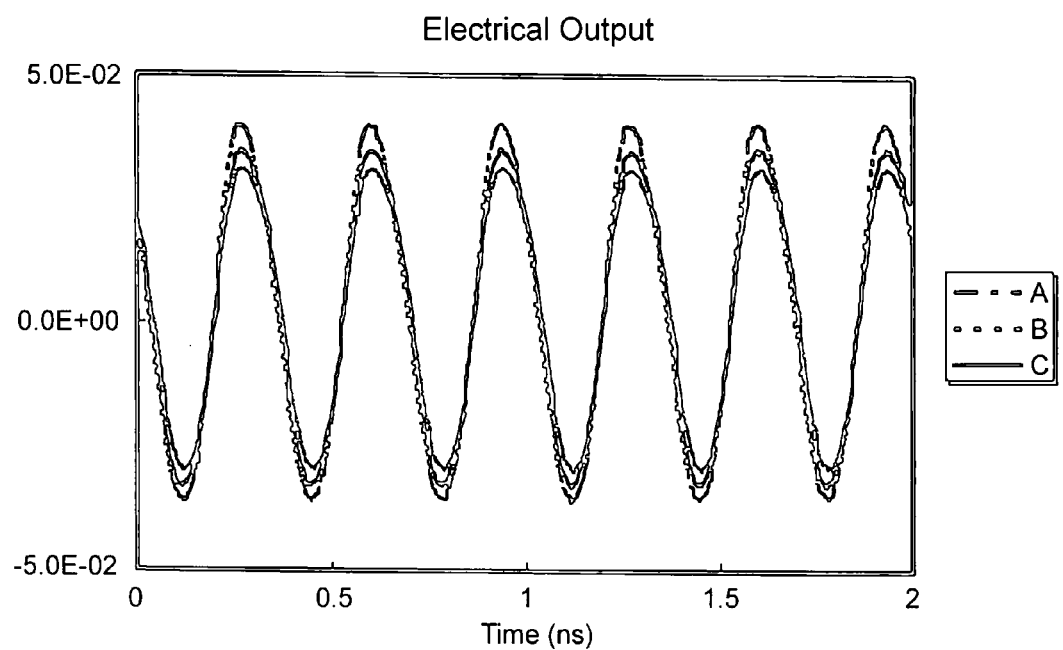
FIG. 18 shows the electrical output for operation at each of the different operating points.
Figure 19:
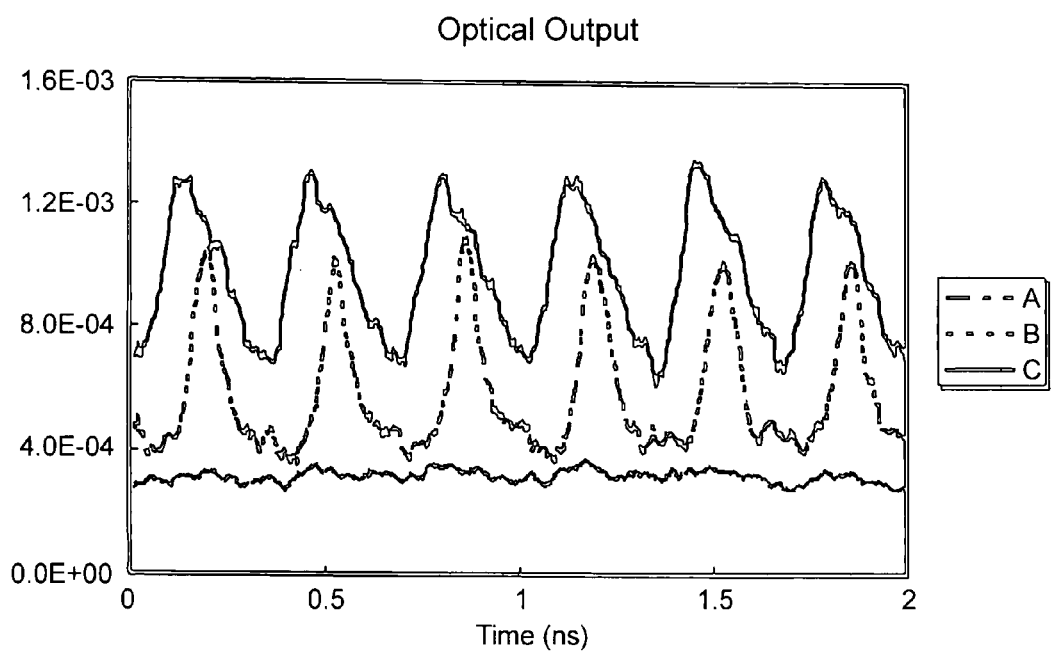
FIG. 19 shows the optical output for operation at each of the different operating points.

The graph of FIG. 17, which also illustrates exemplary electrical input (above the graph), electrical output (below the graph), and optical output (on the right side of the graph), shows how three different output DC bias conditions can be used to generate optical outputs with controllable pulse widths. FIGS. 19 and 20 respectively show the three electrical and optical outputs, for the three respective operating points, plotted together.

The invention claimed is:

1. A method for producing controllable light pulses, comprising the steps of:
    providing a heterojunction bipolar transistor structure comprising collector, base, and emitter regions of semiconductor materials;
    providing an optical resonant cavity enclosing at least a portion of said transistor structure; and
    coupling electrical signals with respect to said collector, base, and emitter regions, to switch back and forth between a stimulated emission mode that produces output laser pulses and a spontaneous emission mode.

2. The method as defined by claim 1, wherein said electrical signals include an AC excitation signal, and wherein part of each excitation signal cycle is operative to produce stimulated emission, and another part of each excitation signal cycle is operative to produce spontaneous emission.

3. The method as defined by claim 2, wherein, during said part of said cycle, the current in the base region exceeds the stimulated emission threshold of said device, and during said other part of said cycle, the current in the base region does not exceed said threshold.

4. The method as defined by claim 3, further comprising controlling the frequency of said excitation signal to control the frequency of said output laser pulses and controlling the relative amplitude of said excitation signal to control the pulse width of said output laser pulses.

5. The method as defined by claim 3, further comprising controlling the relative amplitude of said excitation signal to control the pulse width of said output laser pulses.

6. The method as defined by claim 2, further comprising providing said AC excitation signal at a frequency of at least about 1 GHz.

7. The method as defined by claim 2, further comprising providing said AC excitation signal at a frequency of at least about 3 GHz.

8. The method as defined by claim 4, further comprising providing said AC excitation signal at a frequency of at least about 3 GHz.

9. The method as defined by claim 4, wherein said pulse width is controlled to have a pulse width of less than about 100 picoseconds.

10. The method as defined by claim 5, wherein said pulse width is controlled to have a pulse width of less than about 100 picoseconds.

11. The method as defined by claim 8, wherein said pulse width is controlled to have a pulse width of less than about 100 picoseconds.

12. Apparatus for producing controllable light pulses, comprising:
    a heterojunction bipolar transistor structure comprising collector, base, and emitter regions of semiconductor materials;
    an optical resonant cavity enclosing at least a portion of said transistor structure; and
    means for coupling electrical signals with respect to said collector, base, and emitter regions, to switch back and forth between a stimulated emission mode that produces output laser pulses and a spontaneous emission mode.

13. Apparatus as defined by claim 9, wherein said electrical signals include an AC excitation signal, and wherein part of each excitation signal cycle is operative to produce stimulated emission, and another part of each excitation signal cycle is operative to produce spontaneous emission.

14. Apparatus as defined by claim 10, wherein, during said part of said cycle, the current in the base region exceeds the stimulated emission threshold of said device, and during said other part of said cycle, the current in the base region does not exceed said threshold.

15. Apparatus as defined by claim 11, further comprising means for controlling the frequency of said excitation signal to control the frequency of said output laser pulses and controlling the relative amplitude of said excitation signal to control the pulse width of said output laser pulses.

16. Apparatus as defined by claim 11, further comprising means for controlling the relative amplitude of said excitation signal to control the pulse width of said output laser pulses.

17. Apparatus as defined by claim 13, further comprising means for providing said AC excitation signal at a frequency of at least about 1 GHz.

18. Apparatus as defined by claim 10, further comprising means for providing said AC excitation signal at a frequency of at least about 3 GHz.

19. Apparatus as defined by claim 15, further comprising means for providing said AC excitation signal at a frequency of at least about 3 GHz.

20. Apparatus as defined by claim 15, wherein said pulse width is controlled to have a pulse width of less than about 100 picoseconds.

21. Apparatus as defined by claim 16, wherein said pulse width is controlled to have a pulse width of less than about 100 picoseconds.

22. Apparatus as defined by claim 19, wherein said pulse width is controlled to have a pulse width of less than about 100 picoseconds.

23. A method for producing high frequency laser pulses, comprising the steps of:
  providing a heterojunction bipolar transistor structure comprising collector, base, and emitter regions of semiconductor materials;
  providing an optical resonant cavity enclosing at least a portion of said transistor structure; and
  coupling electrical signals, at least some of which have a frequency of at least about 1 GHz, with respect to said collector, base, and emitter regions, to produce output laser pulses at a frequency of at least about 1 GHz.

24. The method as defined by claim 23, wherein at least some of said electrical signals have a frequency of at least about 3 GHz, and said output laser pulses have a frequency of at least about 3 GHz.

* * * * *